United States Patent
Aoki et al.

(10) Patent No.: US 8,186,047 B2
(45) Date of Patent: May 29, 2012

(54) METHOD OF MOUNTING ELECTRONIC COMPONENT

(75) Inventors: Akira Aoki, Gunma (JP); Makio Kameda, Saitama (JP); Yoshihara Fukushima, Gunma (JP); Katsuyuki Seto, Gunma (JP); Hideaki Fukushima, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 461 days.

(21) Appl. No.: 12/434,500

(22) Filed: May 1, 2009

(65) Prior Publication Data

US 2009/0211086 A1    Aug. 27, 2009

Related U.S. Application Data

(62) Division of application No. 11/340,866, filed on Jan. 27, 2006, now Pat. No. 7,721,424.

(30) Foreign Application Priority Data

Jan. 28, 2005    (JP) ................................ 2005-021957

(51) Int. Cl.
*H05K 3/30* (2006.01)
(52) U.S. Cl. .......................................... 29/833; 29/709
(58) Field of Classification Search ................ 356/621, 356/638; 29/832–834, 709, 721
See application file for complete search history.

(56) References Cited

U.S. PATENT DOCUMENTS

| | | |
|---|---|---|
| 5,588,195 A | 12/1996 | Asai et al. |
| 5,619,328 A | 4/1997 | Sakurai |
| 6,000,123 A | 12/1999 | Munezane et al. |
| 6,718,630 B2 | 4/2004 | Hada et al. |
| 7,065,864 B2 * | 6/2006 | Yamamoto et al. ............. 29/834 |

FOREIGN PATENT DOCUMENTS

| | | |
|---|---|---|
| EP | 1161129 | 12/2001 |
| JP | 2003-069287 | 3/2003 |

OTHER PUBLICATIONS

Aoki et al., U.S. Office Action mailed Jul. 23, 2008, directed to U.S. Appl. No. 11/340,866; (7 pages).
Aoki et al., U.S. Office Action mailed Jan. 15, 2009, directed to U.S. Appl. No. 11/340,866; (7 pages).
Aoki et al., U.S. Office Action mailed Jun. 25, 2009, directed to U.S. Appl. No. 11/340,866; (7 pages).
European Search Report mailed on Jan. 20, 2009 directed towards foreign application No. 06001797.7; 5 pages.

* cited by examiner

*Primary Examiner* — Donghai D. Nguyen
(74) *Attorney, Agent, or Firm* — Morrison & Foerster LLP

(57) ABSTRACT

The invention is directed to prevention of interference of an operation of mounting proper electronic components and improvement of usability without reduction of a manufacturing speed of printed boards. Suction states of electronic components held by suction by suction nozzles are detected by a line sensor unit. When the detection result shows that there is an improper electronic component, the improper electronic component is disposed of, and after the disposal a component recognition camera takes images of electronic components judged proper as a result of the detection and a recognition processing device performs a recognition process. When the recognition result shows that there is an improper electronic component, the improper electronic component is disposed of, and after the disposal only electronic components judged proper as a result of the recognition are mounted on a printed board.

1 Claim, 18 Drawing Sheets

METHOD OF MOUNTING ELECTRONIC COMPONENT

CROSS-REFERENCE OF THE INVENTION

This application claims priority from Japanese Patent Application No. 2005-21957, the content of which is incorporated by reference in its entirety. This application is a divisional application of U.S. Ser. No. 11/340,866, filed Jan. 27, 2006, now U.S. Pat. No. 7,721,424.

BACKGROUND OF THE INVENTION

1. Field of the Invention

The invention relates to an electronic component mounting method and an electronic component mounting apparatus, in which electronic components are picked up from a component feeding unit by suction by a plurality of suction nozzles, a component recognition camera takes images of the electronic components, a recognition processing device performs a recognition process to the images, and the only electronic components that are judged proper as a result of the recognition are mounted on a printed board.

2. Description of the Related Art

When the component recognition camera takes an image of an electronic component held by suction by the suction nozzle and the electronic component is judged improper, for example, when the electronic component is recognized as wrong due to its bending lead or so-called standing suction (including wrong posture or improper suction), the component is collected in a component collection box. The relevant technology is described in the Japanese Patent Application Publication No. 2003-69287.

In a mounting method where electronic components judged proper as a result of the recognition are mounted on a printed board and thereafter the electronic component judged improper as a result of the recognition is disposed of, there can be a problem that the improper electronic component drops to the printed board during the mounting operation of the proper electronic components and the dropping component interferes with the mounting operation of the proper electronic components.

The invention is directed to prevention of the interference with the mounting operation of the proper electronic components and improvement of usability without the reduction of the manufacturing speed of the printed boards.

SUMMARY OF THE INVENTION

The invention provides a method of mounting an electronic component. The method includes picking up a plurality of electronic components from a component feeding unit by suction using a plurality of suction nozzles, taking images of the electronic components held by the suction nozzles using a component recognition camera, performing a recognition processing to the images taken by the component recognition processing camera, releasing one of the electronic components that is judged improper as a result of the recognition processing, and mounting on a printed board electronic components that are judged proper as the result of the recognition processing after the releasing of the improper electronic component.

The invention also provides an electronic component mounting apparatus that includes a component feeding unit storing a plurality of electronic components, a plurality of suction nozzles picking up the electronic components from the component feeding unit, a component recognition camera taking images of the electronic components held by the suction nozzles, a recognition processing device performing a recognition process to the images taken by the component recognition camera, and a selection device selecting a first mounting sequence in which electronic components judged proper as a result of the recognition processing are mounted on a printed board after electronic components judged improper as the result of the recognition process are released from the suction nozzles or a second mounting sequence in which the electronic components judged improper as the result of the recognition process are released from the suction nozzles after the electronic components judged proper as the result of the recognition processing are mounted on a printed board.

DETAILED DESCRIPTION OF THE INVENTION

Figure 1:
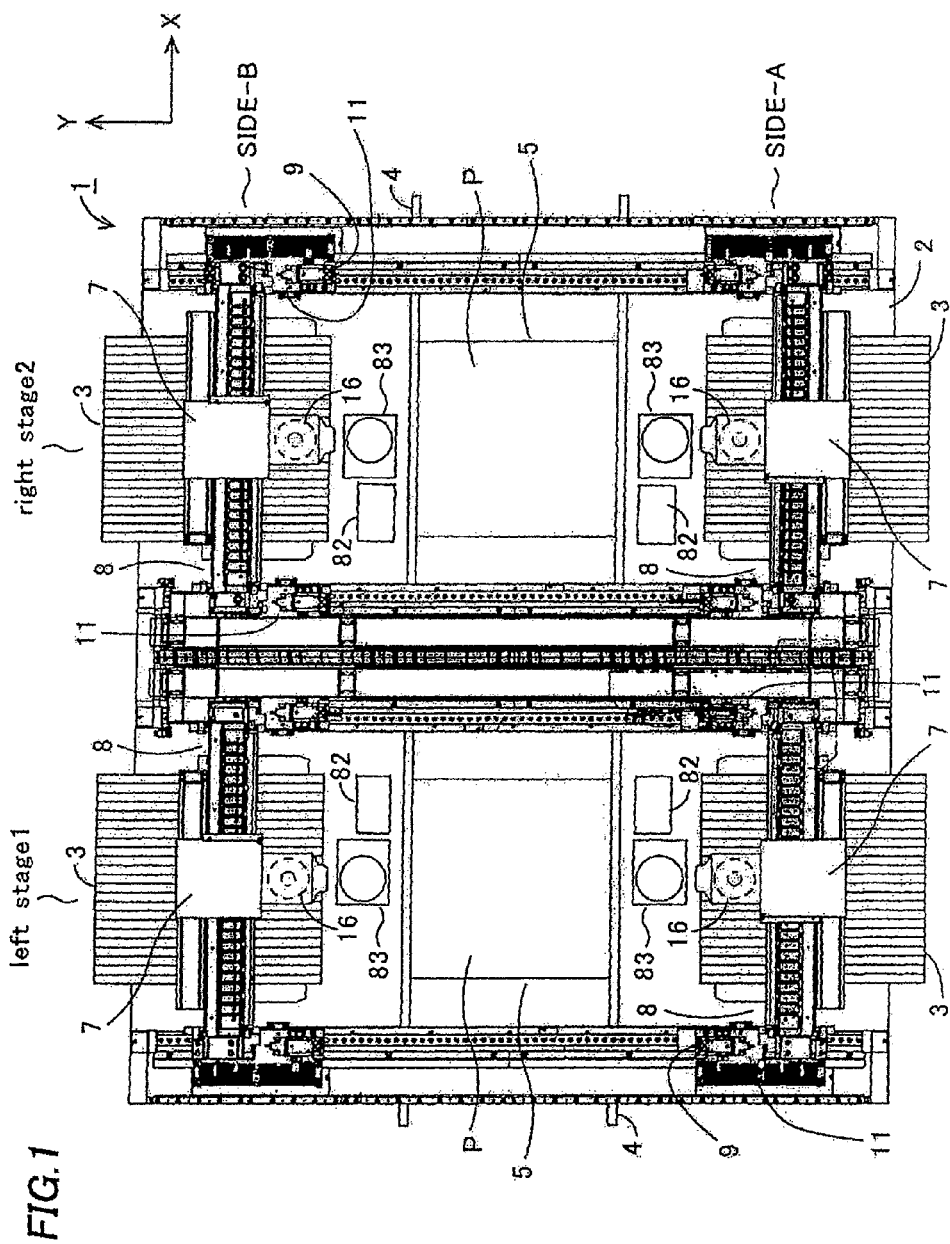
FIG. 1 is a plan view of an electronic component mounting apparatus of an embodiment of the invention.

An embodiment of an electronic component mounting apparatus will be described with reference to figures. FIG. 1 is a plan view of an electronic component mounting apparatus 1, and a plurality of well-known component feeding units 3 as a component feeding device which supplies electronic components to a component pickup position (component suction position) one by one is aligned in each of four blocks on a base (apparatus body) 2 of the electronic component mounting apparatus 1. That is, the electronic component mounting apparatus 1 is divided into a left stage 1 and a right stage 2, and further divided into a front portion SIDE-A and a rear portion SIDE-B in each of the stages, so that there are four blocks divided.

A feeding conveyer 4 is provided in a middle portion of the mounting apparatus 1 so that a printed board P can be conveyed in a lateral direction. A positioning mechanism for positioning a printed board P received from an upstream device on each of two positioning portions is provided in the feeding conveyer 4, where electronic components are mounted on the printed board P and then the printed board P is conveyed to a downstream device.

A numeral 8 designates a pair of beams extending in an X direction. Each of the beams 8 respectively moves in a Y direction above the printed board P fixed by the positioning portion 5 or the component feeding positions (component pick-up positions) of the component feeding units 3 as sliders 11 fixed to each of the beams 8 slide along a pair of left and right guides, driven by each of linear motors 9. Each of the linear motors 9 has a pair of upper and lower stationary members fixed on the base 2 and a moving member fixed to a lower part of an attachment board provided on each end of the beam 8.

Each of the beams 8 is provided with a mounting head body 7 which moves in a longitudinal direction, i.e., in the X direction along guides 13 driven by the linear motor 14. The linear motor 14 has a pair of front and back stationary members 14A fixed to the beam 8 and a moving member 14B provided on the mounting head body 7. Each of the mounting head bodies 7 has a mounting head 16 having twelve suction nozzles 15 each fixed to and pulled up by each of twelve springs 12.

Figure 2:
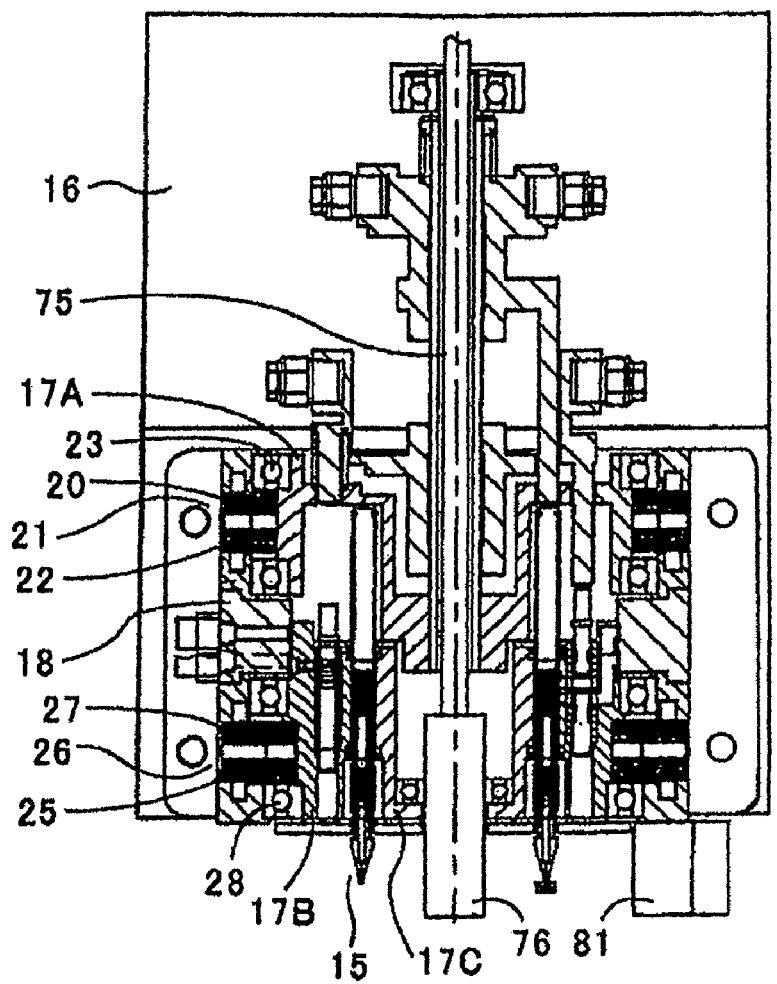
FIG. 2 is a view of a front longitudinal section of a mounting head body of the embodiment.
Figure 3:
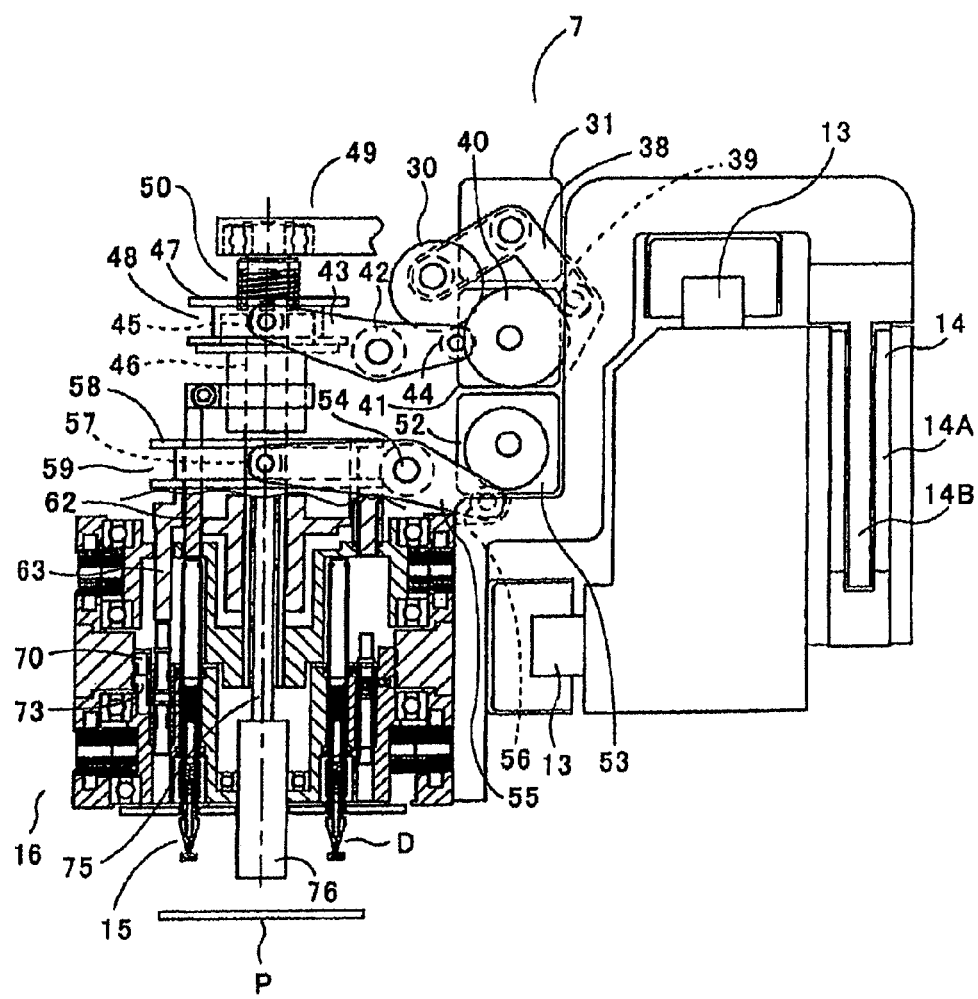
FIG. 3 is a view of a side longitudinal section of the mounting head body of the embodiment holding a thin electronic component by suction.

The mounting head 16 will be described with reference to FIGS. 2 and 3. A numeral 20 designates a rotor of a pulse motor 21 which is provided in an upper part of a first inner cylinder 17A and rotatable in a θ direction being contact with bearings 23 inside a stator 22 provided in an outer cylinder 18 fixed to the mounting head body 7. A numeral 25 designates a rotor of a pulse motor 26 which is provided in a lower part of a second inner cylinder 17B and rotatable in a θ direction being contact with bearings 28 inside a stator 27 provided in the outer cylinder 18 fixed to the mounting head body 7. Twelve suction nozzles 15 are provided on a circumference of a circle at predetermined intervals inside the second inner cylinder 17B, being movable upward and downward.

Figure 4:
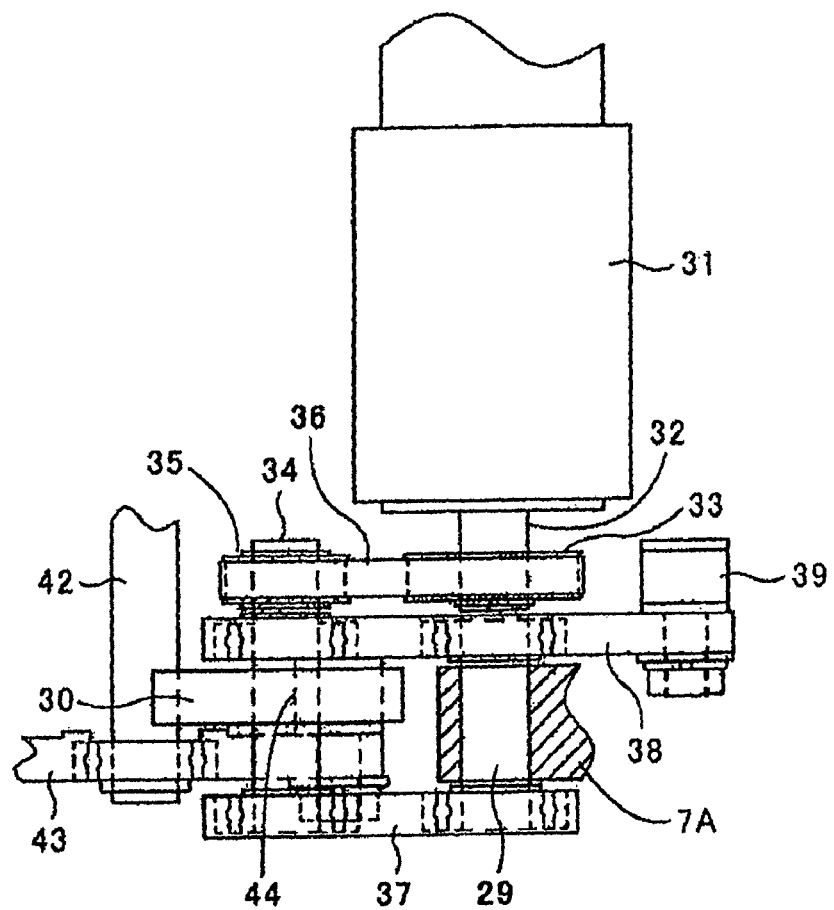
FIG. 4 is a plan view of a first cam, a first lever, and so on of the embodiment.
Figure 5:
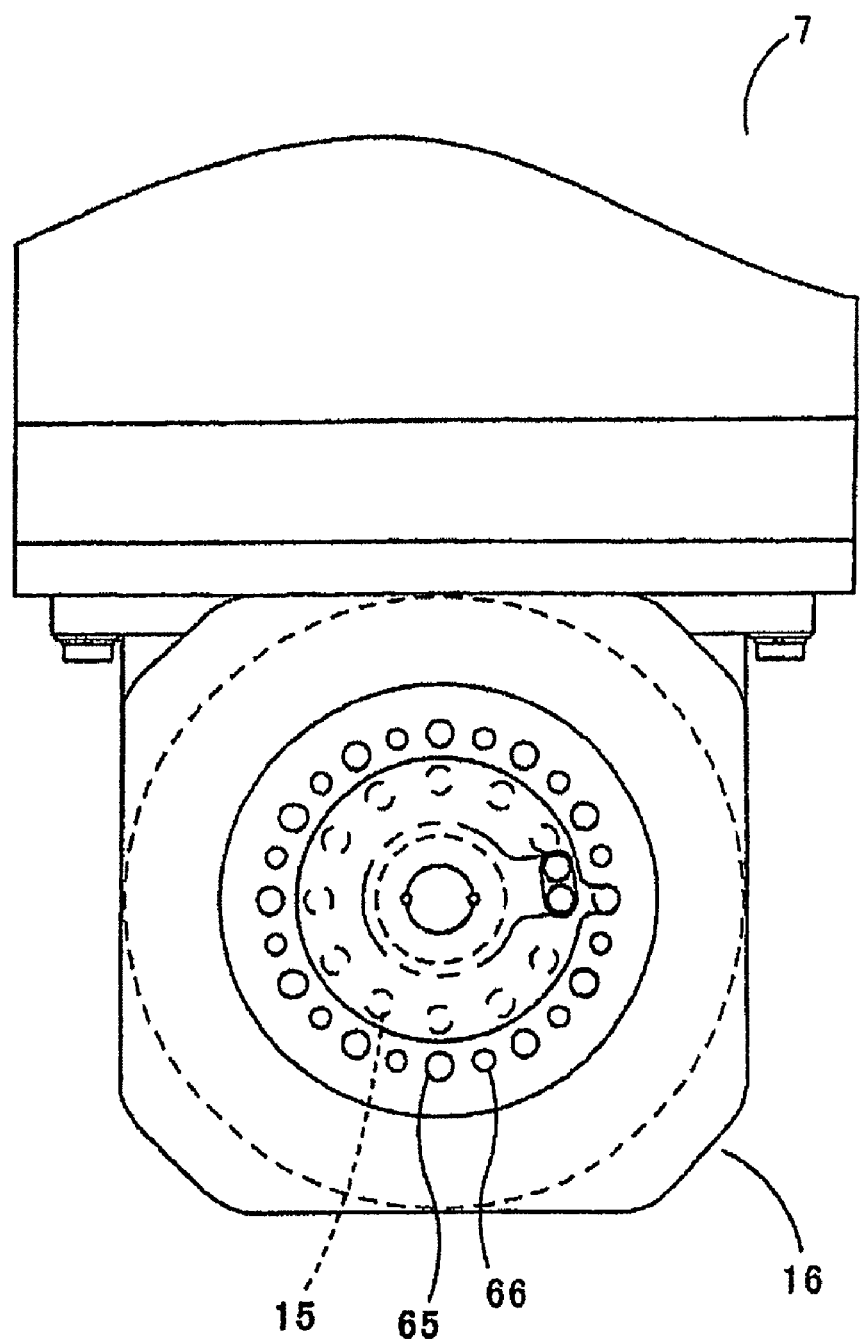
FIG. 5 is a plan view of the mounting head body of the embodiment.
Figure 6:
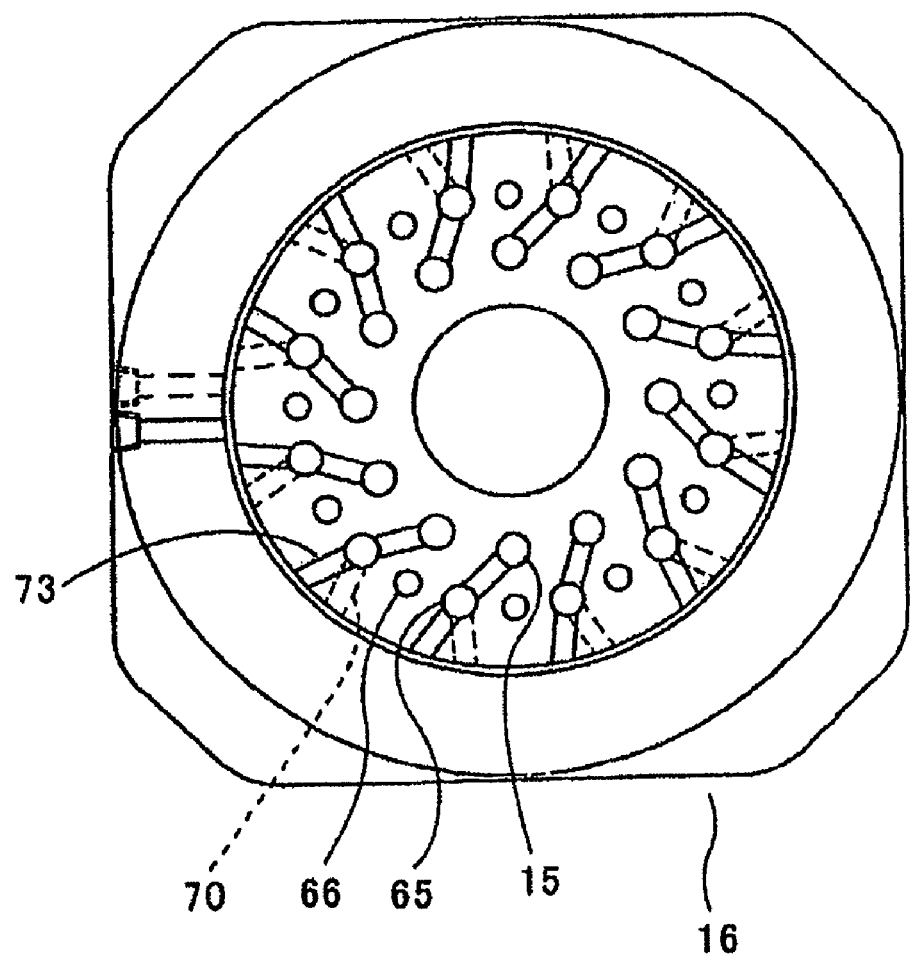
FIG. 6 is a simple plan view for explaining a vacuum or air blow state of the embodiment when an electronic component is held by suction or mounted by a suction nozzle.

A numeral 30 designates a first cam which makes a basic up-and-down stroke of the suction nozzles 15. The first cam 30 which is fixed to a follower axis 34 rotates by a belt 36 stretched between a pulley 33 provided on a driving axis 32 and a pulley 35 provided on the follower axis 34, driven by a drive motor 31 (FIG. 4). A cam follower 39 is provided on one side of a first lever 38 which is rotatable around a support axis 29 supported by a support portion 7A extending from the mounting head body 7. The support axis 29 and the follower axis 34 are connected with a connecting lever 37.

A numeral 40 designates a second cam which rotates driven by a drive motor 41 and makes an aligned up-and-down stroke of the suction nozzles 15 corresponding to a thickness of an electronic component. The cam follower 39 is pressed into contact with a circumference of the second cam 40. A cam follower 44 is provided on one end of the second lever 43 which turns around a support axis 42, and is pressed into contact with a circumference of the first cam 30. A cam follower 45 is provided on another end of the second lever 43, and engaged with a cam engagement portion 48 of a vertical shift body 47 which is movable upward and downward along a strut 46 which is a center of θ rotation of the mounting head 16. A spring 50 is interposed between the vertical shift body 47 and a support body 49, and pressurizes the vertical shift body 47 downward.

A numeral 52 designates a third cam for switching a vacuum valve, which rotates driven by the drive motor 53. A cam follower 56 on one end of a third lever 55 which turns around a support axis 54 is pressed into contact with the third cam 52. A cam follower 57 on another end of the third lever 55 is engaged with a cam engagement portion 59 of a vacuum valve switch operating body 58 which is movable upward and downward corresponding to movement of the vertical shift body 47.

The vertical shift body 47 is provided with a vertical shift bar 62 for raising and lowering the suction nozzles 15. By rotation of the first cam 30 and the second cam 40, the first lever 38 and the second lever 43 turn around the support axis 29 and the support axis 42 respectively. Then, the vertical shift body 47 descends and the vertical shift bar 62 lowers the suction nozzles 15 by a predetermined stroke corresponding to a thickness of an electronic component D, thus completing mounting of the electronic component D on the printed board P.

Figure 7:
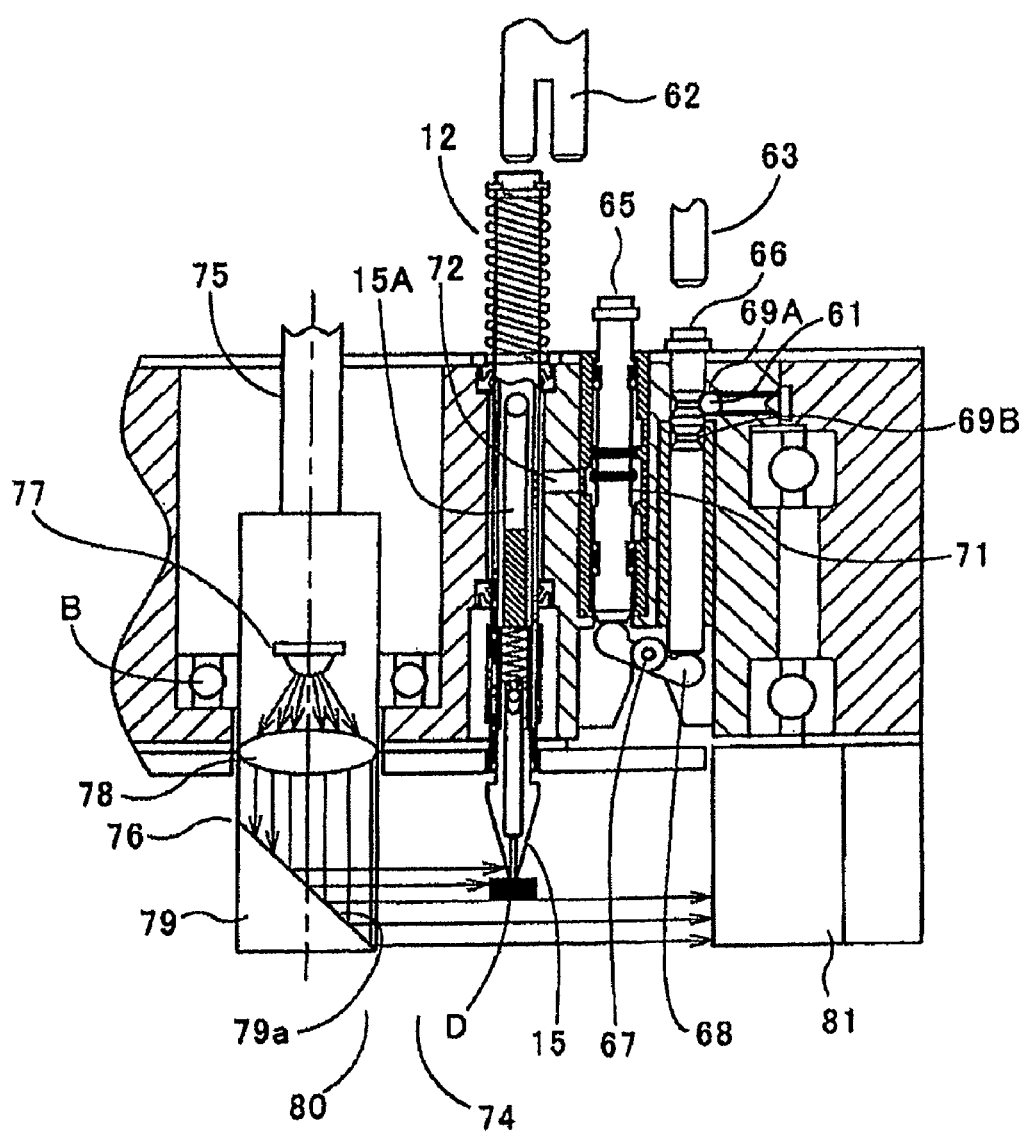
FIGS. 7 and 15 are views of a side longitudinal section of a main portion of the mounting head body of the embodiment holding a thin electronic component by suction.
Figure 8:
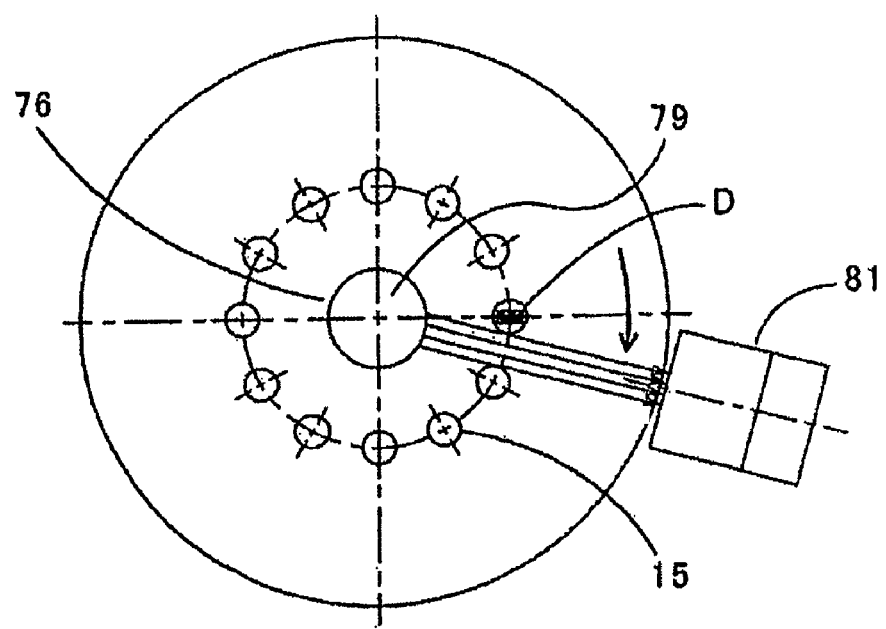
FIG. 8 shows a bottom surface of the main portion of FIG. 2.
Figure 12:
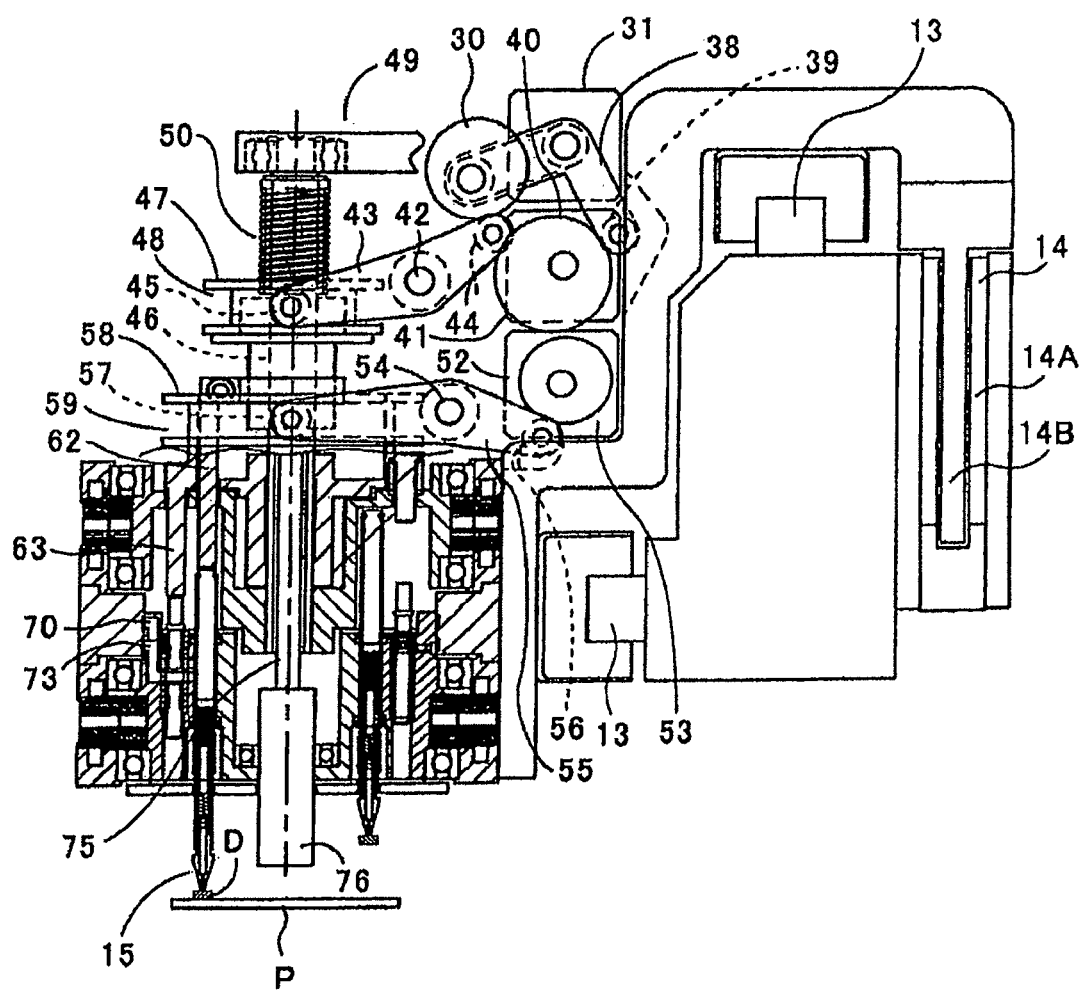
FIG. 12 is a view of a side longitudinal section of the mounting head body of the embodiment mounting a thin electronic component.
Figure 13:
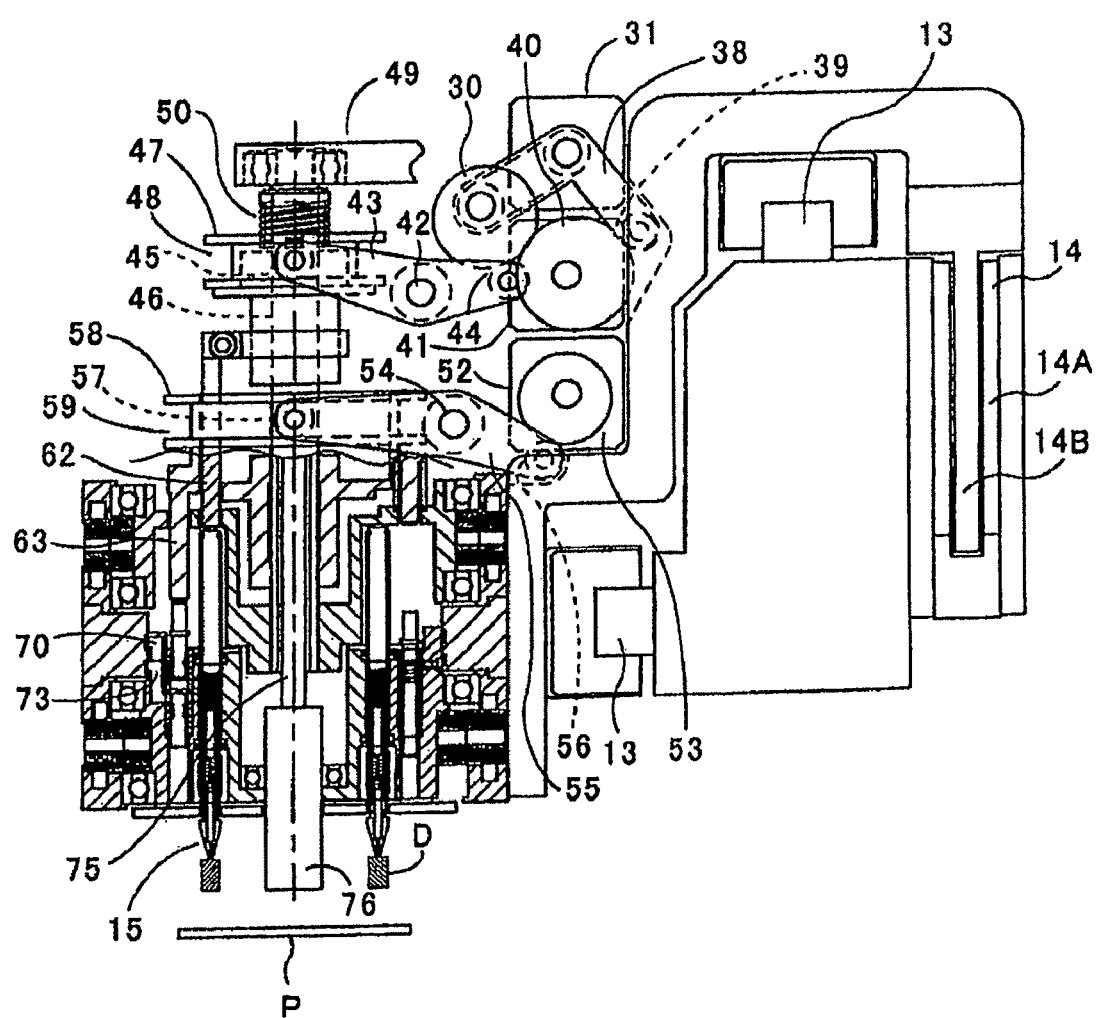
FIG. 13 is a view of a side longitudinal section of the mounting head body of the embodiment holding a thick electronic component by suction.
Figure 14:
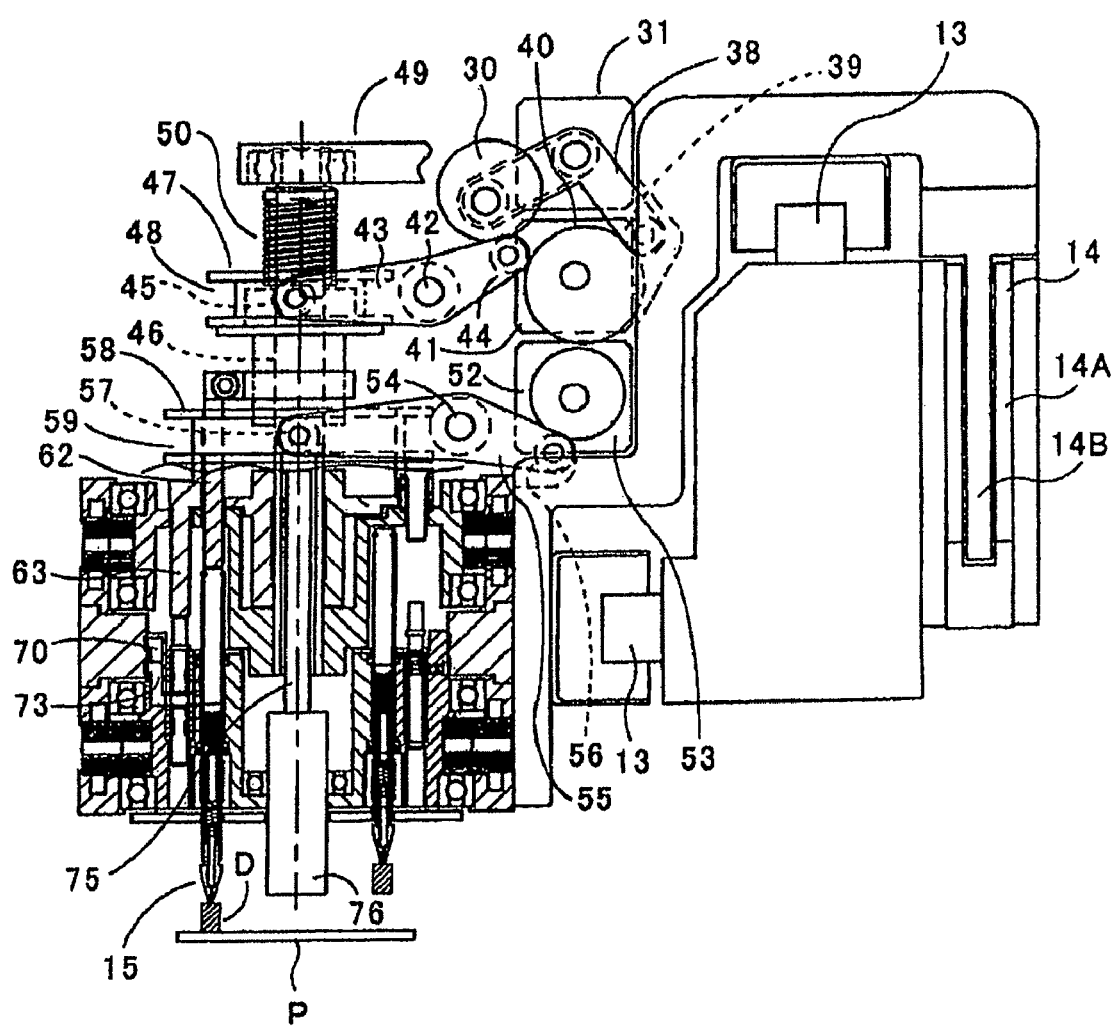
FIG. 14 is a view of a side longitudinal section of the mounting head body of the embodiment mounting a thick electronic component.

When the suction nozzle 15 descends for mounting, as shown in FIGS. 12 (for mounting a thin electronic component) and 14 (for mounting a thick electronic component), turning of the third lever 55 by rotation of the third cam 52 makes the vacuum valve switch operating body 58 descend corresponding to descending of the vertical shift body 47 connected therewith through the cam engagement portion 59. The vertical shift bar 63 of the vacuum valve switch operating body 58 depresses a first switch bar 65 to turn a switch lever 68 around a support axis 67 and to push a second switch bar 66 upward, so that a projected stopper 61 is engaged with a recess for engagement 69B of the second switch bar 66. When picking the electronic component up, as shown in FIGS. 3, 13, and 7, the vertical shift bar 63 of the vacuum valve switch operating body 58 depresses the second switch bar 66 to turn the switch lever 68 around the support axis 67 and to push the first switch bar 65 upward, so that the projected stopper 61 is engaged with a recess for engagement 69A of the second switch bar 66.

The vacuum path is disconnected from a vacuum source and air blows in the suction nozzle 15 so as to cease the vacuum suction of the electronic component D by the suction nozzle 15 when the first switch bar 65 descends in response to the descending of the vertical shift bar 63 of the vacuum valve switch operating body 58 during the mounting. On the other hand, the vacuum path is connected to the vacuum source so as to maintain the vacuum suction of the electronic component D by the suction nozzle 15 when the second switch bar 66 descends.

That is, air from an air supply source blows in an inner path 15A of the suction nozzle 15 through an air path 70, a path 71, and a connecting path 72 in the state where the first switch bar 65 descends. On the contrary, vacuum suction is performed by connecting the inner path 15A of the suction nozzle 15 to the vacuum source through the connecting path 72, the path 71, and a vacuum path 73 in the state where the second switch bar 66 descends.

Figure 15:
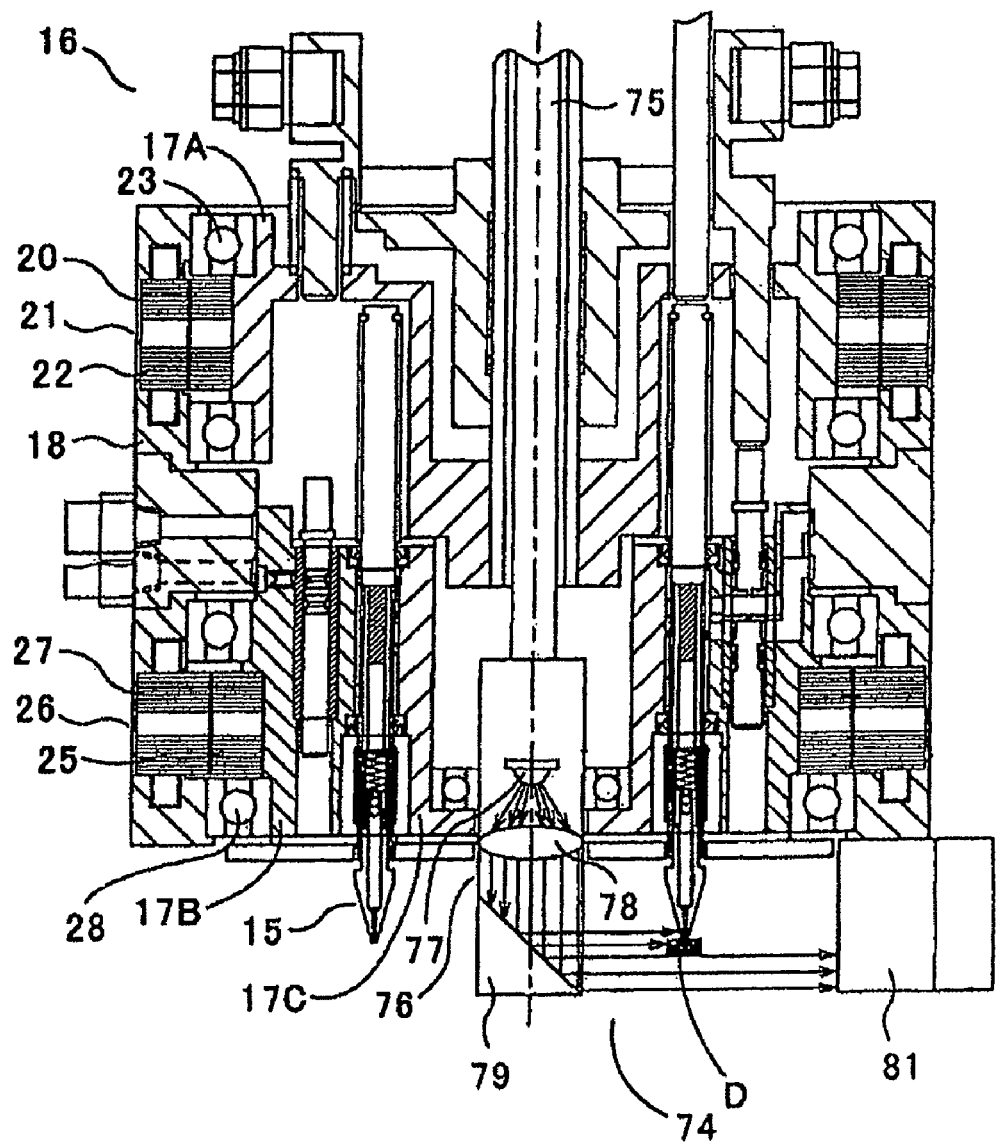

A numeral 74 designates a line sensor unit for detecting presence or absence and an attached posture of an electronic component and a diameter of a suction nozzle. As shown in FIGS. 7 and 15, the line sensor unit 74 has a light emitting unit 80 and a light receiving unit 81. The light emitting unit 80 has a light emitting element 77 such as an LED in an upper part of a cylindrical light emitting unit attachment body 76, a lens 78 below the light emitting element 77, and a prism 79 having a reflective surface 79a provided with an inclination of 45 degrees below the lens 78. The cylindrical light emitting unit attachment body 76 is provided on a lower end of a strut 75 provided almost in a center of each of the mounting heads 16. Bearings B are provided between the cylindrical light emitting unit attachment body 76 and the third inner cylinder 17C. A light receiving unit 81 has CCD elements arrayed in a matrix as a plurality of receiving elements for receiving light emitted from the light emitting element 77 through the prism 79, being fixed on a bottom of the outer cylinder 18. The mounting head 16 with the line sensor unit 74 can be minimized by placing the line sensor unit 74 as above.

Figure 16:
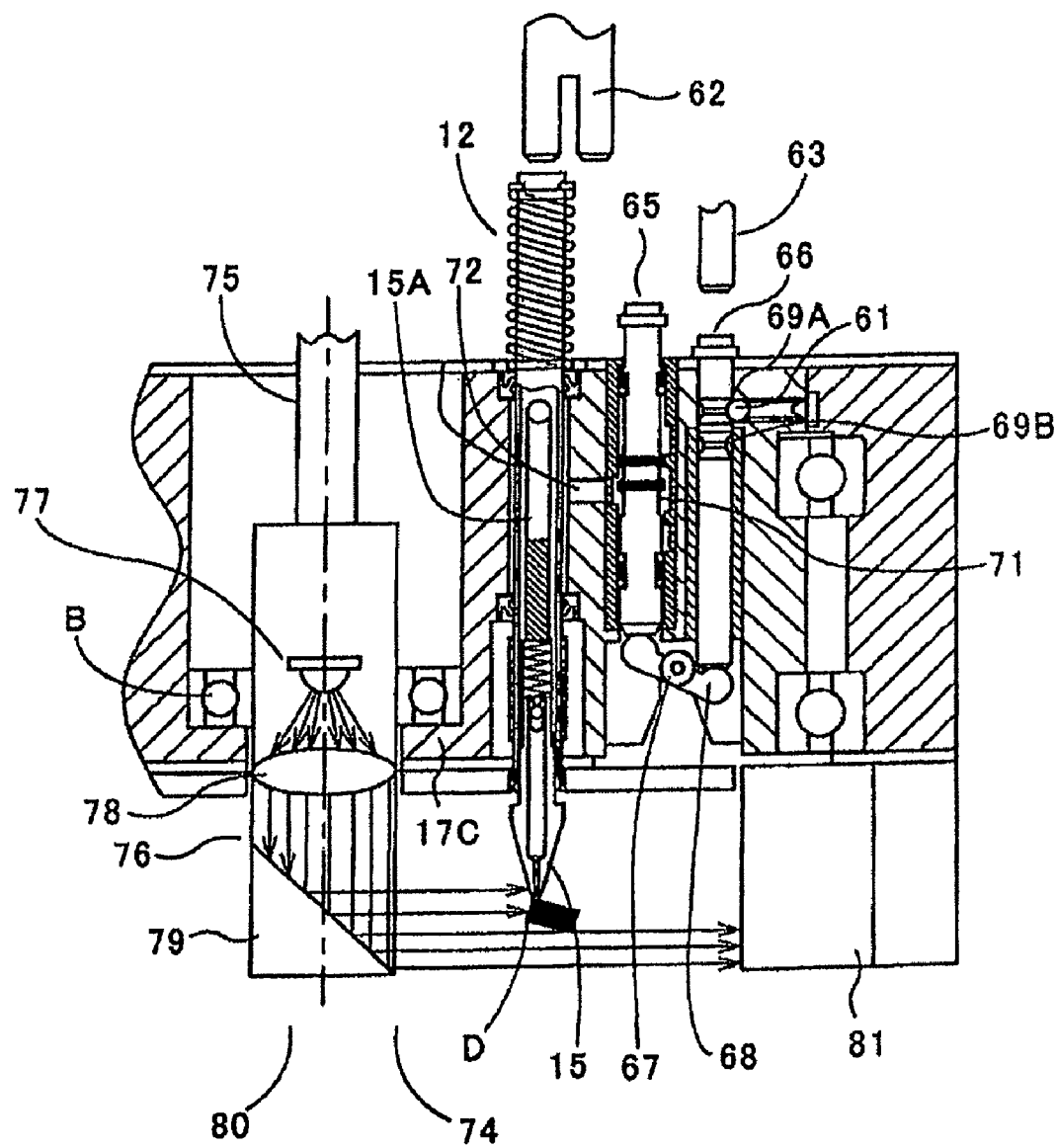
FIG. 16 is a view of a side longitudinal section of the main portion of the mounting head body of the embodiment holding and slanting the electronic component.

This enables differentiating a case where the electronic component is picked up with a normal position as shown in FIG. 7 from a case where the component is picked up with its wrong surface being attached to the suction nozzle, i.e., standing or slanting (FIG. 16), since height of a lower end surface of the electronic component D can be detected by recognizing a border between the position receiving no light and the position receiving light in each of the CCD elements. In detail, after the suction nozzle 15 descends, picks up the electronic component D from the component feeding unit 3 by suction, and rises up, the pulse motors 21 and 26 are driven to rotate the mounting head 16, i.e., the first inner cylinder 17A and the second inner cylinder 17B rotate around the strut 75 to rotate the suction nozzle 15 holding the electronic component D by suction. When the electronic component D held by the suction nozzle 15 comes between the prism 79 and the light receiving unit 81 while the suction nozzle 15 is rotating, presence or absence, an attached posture and so on of the component can be detected by detecting height of the lower end surface of the electronic component D at plural positions.

The outside diameter of the suction nozzle 15 can be also detected by rotating the mounting head 16 at a predetermined speed by driving the pulse motors 21 and 26 at a predetermined speed. In detail, the suction nozzle 15 passes between the prism 79 and the light receiving unit 81 by the rotation of the mounting head 16, so that the outside diameter of the suction nozzle 15 can be detected by detecting a light-shielded time at the CCD elements as the light receiving elements which receive light from the light emitting element 77 through the prism 79. Although the detection is performed while the mounting head 16 is rotating and moving in this embodiment, alternatively the detection can be performed with the mounting head 16 being stopped between the prism 79 and the light receiving unit 81.

In a case where the electronic component D is not detected, light emitted from the light emitting element 77 is received by the light receiving unit 81. Thus, the detection result is "absence" of the electronic component D so that the vertical shift bar 63 of the vacuum valve switch operating body 58 descends to lower the first switch bar 65 and vacuum suction is stopped by disconnecting the vacuum path from the vacuum source by closing a vacuum valve (not shown), preventing leaking. In a case where the electronic component is detected as being attached to the suction nozzle 15 at its wrong surface, i.e., with standing or slanting, the mounting head 16 and the suction nozzle 15 moves to a position above a disposal box 82 (FIG. 1), and drops the electronic component D therein.

Even in a case where the electronic component is detected as being attached properly, a lower end level (lower end position) of the electronic component D can be detected so that a CPU 90 controls the drive motor 31 to change an amount of a descending stroke of the suction nozzle 15 for mounting the component D on the printed board P corresponding to the lower end level. This compensates for variations in type of the components D. In detail, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke.

A numeral 83 designates a component recognition camera. The component recognition camera 83 is provided for each of the mounting heads 16 so that there are four cameras 83 in total. The cameras 83 sequentially take images of all the electronic components D picked up by the suction nozzles 15 to detect an amount of shifting from a proper position of the electronic component D on the suction nozzle 15 in X and Y directions and at rotating angles. Alternatively, the camera 83 can take images of the plurality of the electronic components D simultaneously. Furthermore, the component recognition camera 83 can recognize whether or not the electronic component D is held by suction by the suction nozzle 15 by taking an image.

Figure 9:
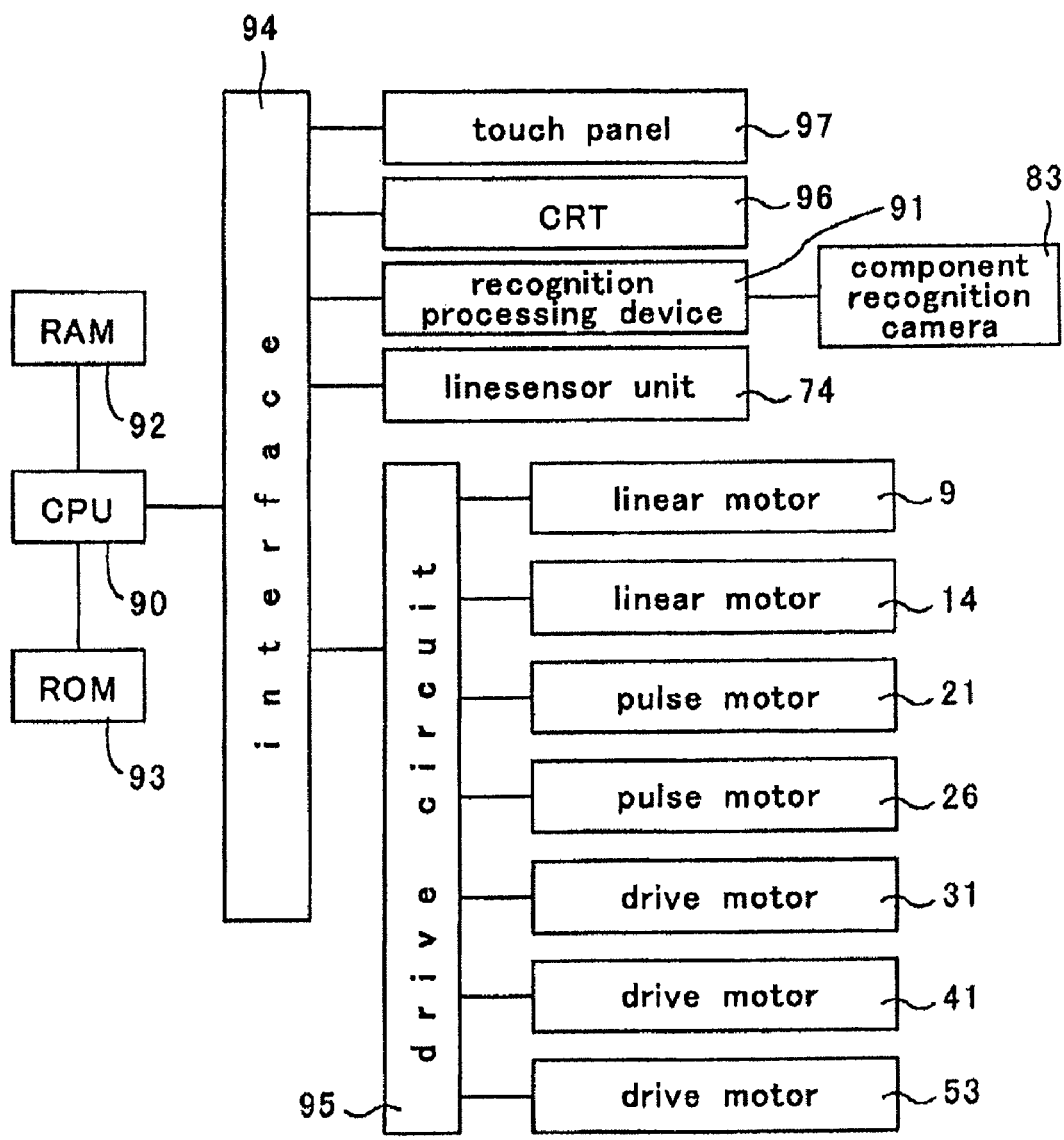
FIG. 9 is a control block diagram.

Next, description will be made with reference to a block diagram showing controlling of the electronic component mounting apparatus 1 in FIG. 9. A numeral 90 designates the CPU (mounting control portion) as a control portion for controlling the mounting apparatus 1. The CPU 90 is connected with a RAM (random access memory) 92 and a ROM (read only memory) 93 through buses. The CPU 90 controls all operation for component mounting of the electronic component mounting apparatus 1 according to programs stored in the ROM 93 based on data stored in the RAM 92. That is, the CPU 90 controls driving of the linear motors 9 and 14, the pulse motors 21 and 26, and the drive motors 31, 41, and 53 through an interface 94 and a drive circuit 95.

The RAM 92 is stored with mounting data on component mounting which include values in the X and Y directions (indicated by X and Y respectively) and an angle (indicated by Z) on the printed board, alignment numbers of the component feeding units 3, and so on in order of component mounting (in order of step number). Furthermore, the RAM 92 is stored with component disposition data which include a type of the electronic component (component ID), alignment coordinates of the component feeding units 3, and so on corresponding to alignment numbers of the component feeding units 3.

A numeral 91 designates a component recognition processing device connected with the CPU 90 through the interface 94. In the component recognition processing device 91, images taken and stored by the component recognition camera 83 undergo recognition processing.

The images taken by the component recognition camera 83 are displayed on the CRT 96. The CRT 96 is provided with various touch panel switches 97 and an operator operates the touch panel switches 97 for various settings including settings for informing.

The touch panel switches 97 include a glass substrate which is coated with a transparent conductive film on its whole surface and printed with electrodes on its four edges. When an operator touches one of the touch panel switches 97 in a state where minimal electric currents flow on the surface of the touch panel switches 97, current flows change at the four electrodes and coordinates of a touched position are calculated by a circuit board connected with the electrodes. If the calculated coordinates correspond to one of coordinates originally stored in the RAM 92, which will be described below, as a switch for executing a certain operation, the operation is executed.

Figure 17:
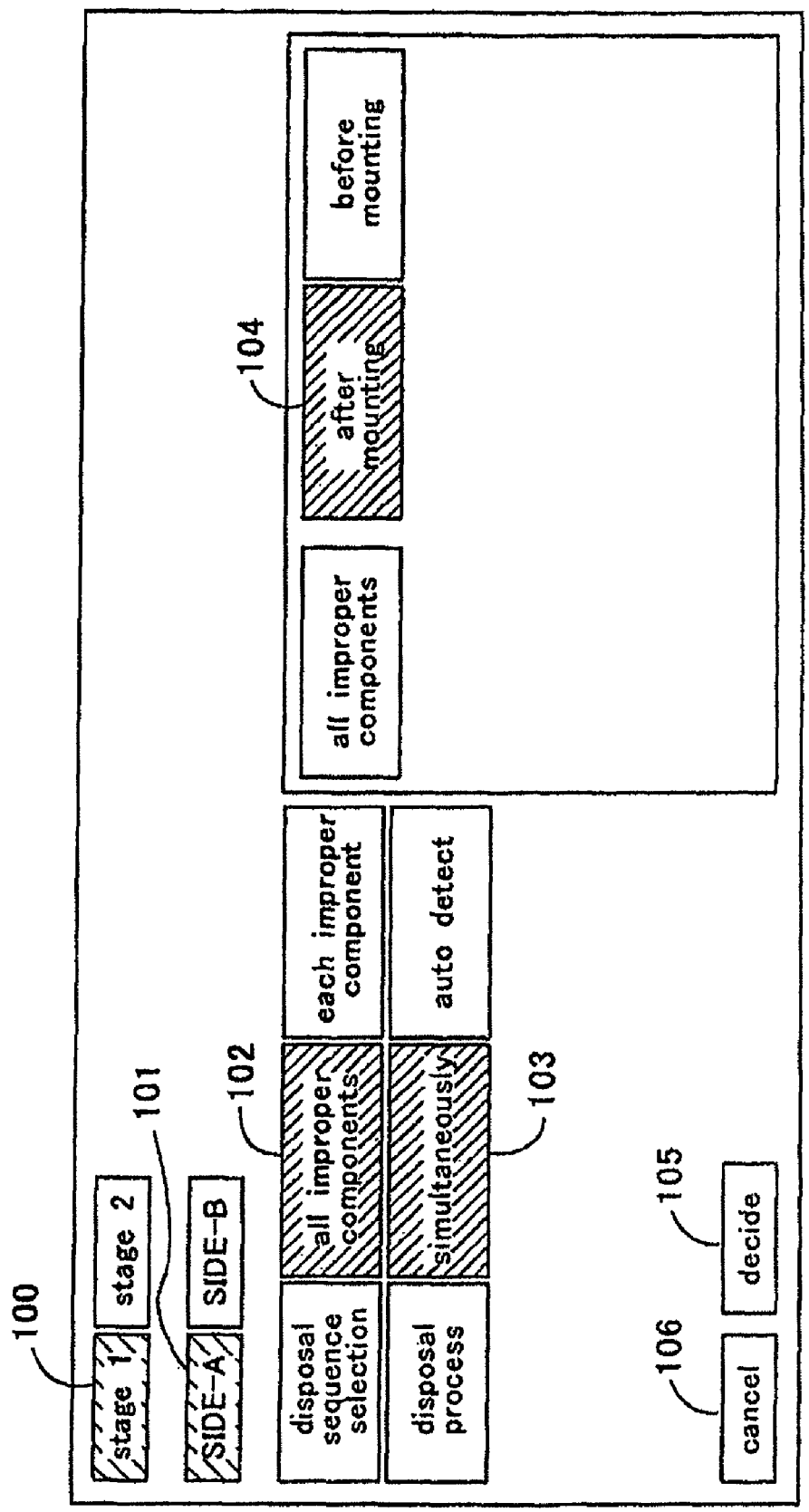
FIG. 17 is a view showing a setting screen of the speed priority mounting sequence.

Either a speed priority mounting sequence (speed priority sequence) or a disposal priority mounting sequence (disposal priority sequence) can be set as an operation method. In detail, as shown in FIG. 17, in the screen displayed on the CRT 96, a mounting sequence can be set for each of the four blocks of the left stage 1, the right stage 2, the front portion SIDE-A, and the rear portion SIDE-B. The setting of the speed priority mounting sequence will be described. First, a "stage 1" switch portion 100 of the touch panel switch 97 is pressed for setting the left stage 1, and further a "SIDE-A" switch portion 101 is pressed for setting the front portion SIDE-A. Then, an "all improper components" switch portion 102 of a "disposal sequence selection" part is pressed and an "after mounting" switch portion 104 of the "all improper components" switch portion 102 displayed when the "all improper components" switch portion 102 is pressed is pressed. Then, a "simultaneously" switch portion 103 of a "disposal process" part is pressed, and then a "decide" switch portion 105 is pressed, thereby completing the setting of the front portion SIDE-A on the left stage 1 to the speed priority mounting sequence. The rear portion SIDE-B of the left stage 1 and the front and rear portions SIDE-A and SIDE-B of the right stage 2 can be also set in the same manner. It is noted that the setting can be canceled by pressing a "cancel" switch portion 106.

Figure 18:
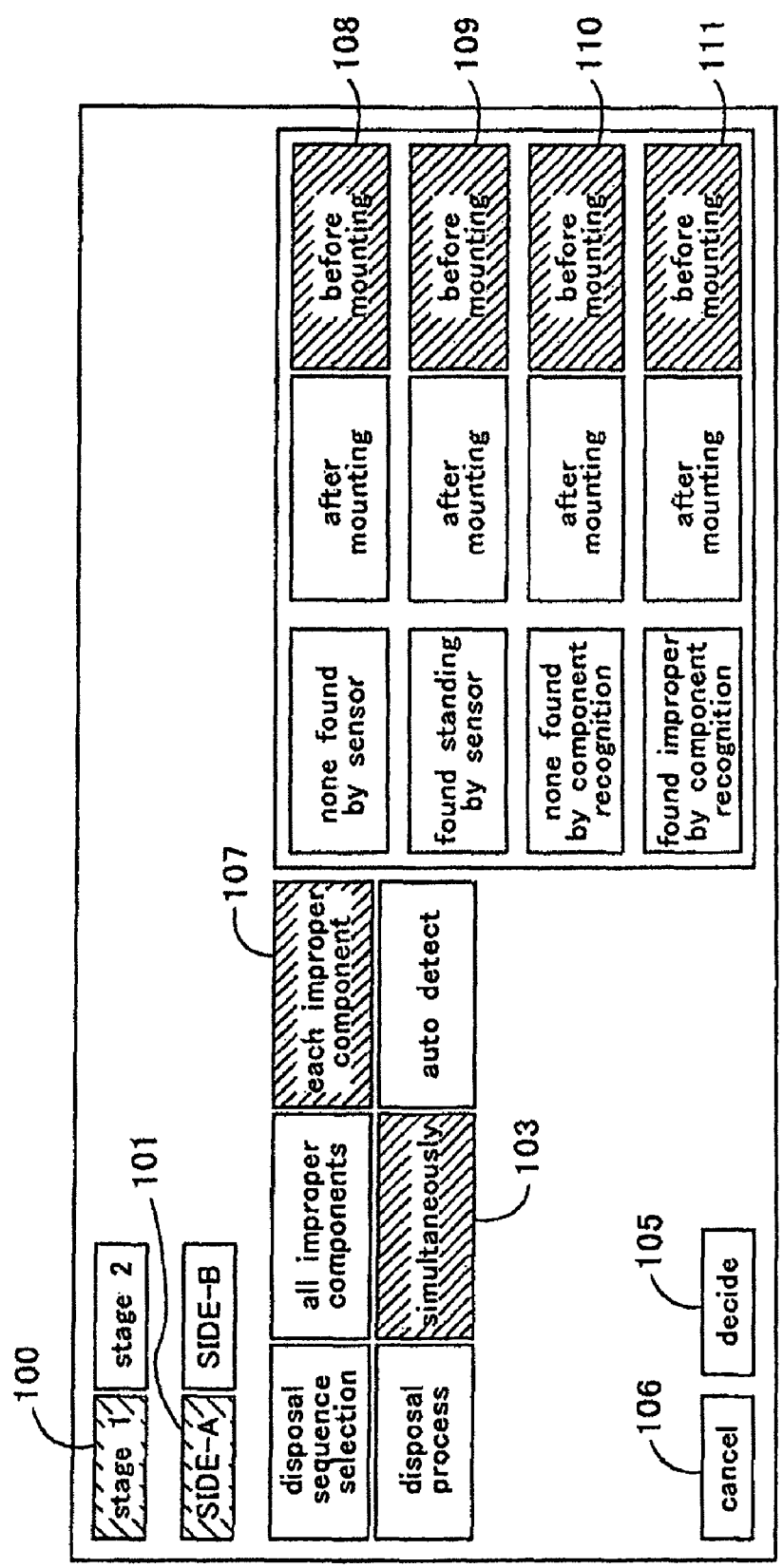
FIG. 18 is a view showing a setting screen of the disposal priority mounting sequence.

Next, the setting of the disposal priority mounting sequence will be described with reference to FIG. 18. First, the "stage 1" switch portion 100 of the touch panel switch 97 is pressed for setting the left stage 1, and further the "SIDE-A" switch portion 101 is pressed for setting the front portion SIDE-A. Then, an "each improper component" switch portion 107 of the "disposal sequence selection" part is pressed, and "before mounting" switch portions 108 to 111 are pressed in the disposal settings of "none found by sensor", "found standing by sensor", "none found by component recognition", "found improper by component recognition" of the "each improper component" switch portion 107 displayed when the "each improper component" switch portion 107 is pressed. Furthermore, the "simultaneously" switch portion 103 of the "disposal process" part is pressed and the "decide" switch portion 105 is pressed, thereby completing the setting of the front portion SIDE-A of the left stage 1 to the disposal priority mounting sequence. The rear portion SIDE-B of the left stage 1 and the front and rear portions SIDE-A and SIDE-B of the right stage 2 can be also set in the same manner. It is noted that the setting can be canceled by pressing the "cancel" switch portion 106.

Accordingly, the described mounting sequence can be set in each of the four blocks of the left and right stages 1 and 2 and the front and rear portions SIDE-A and SIDE-B.

Figure 10:
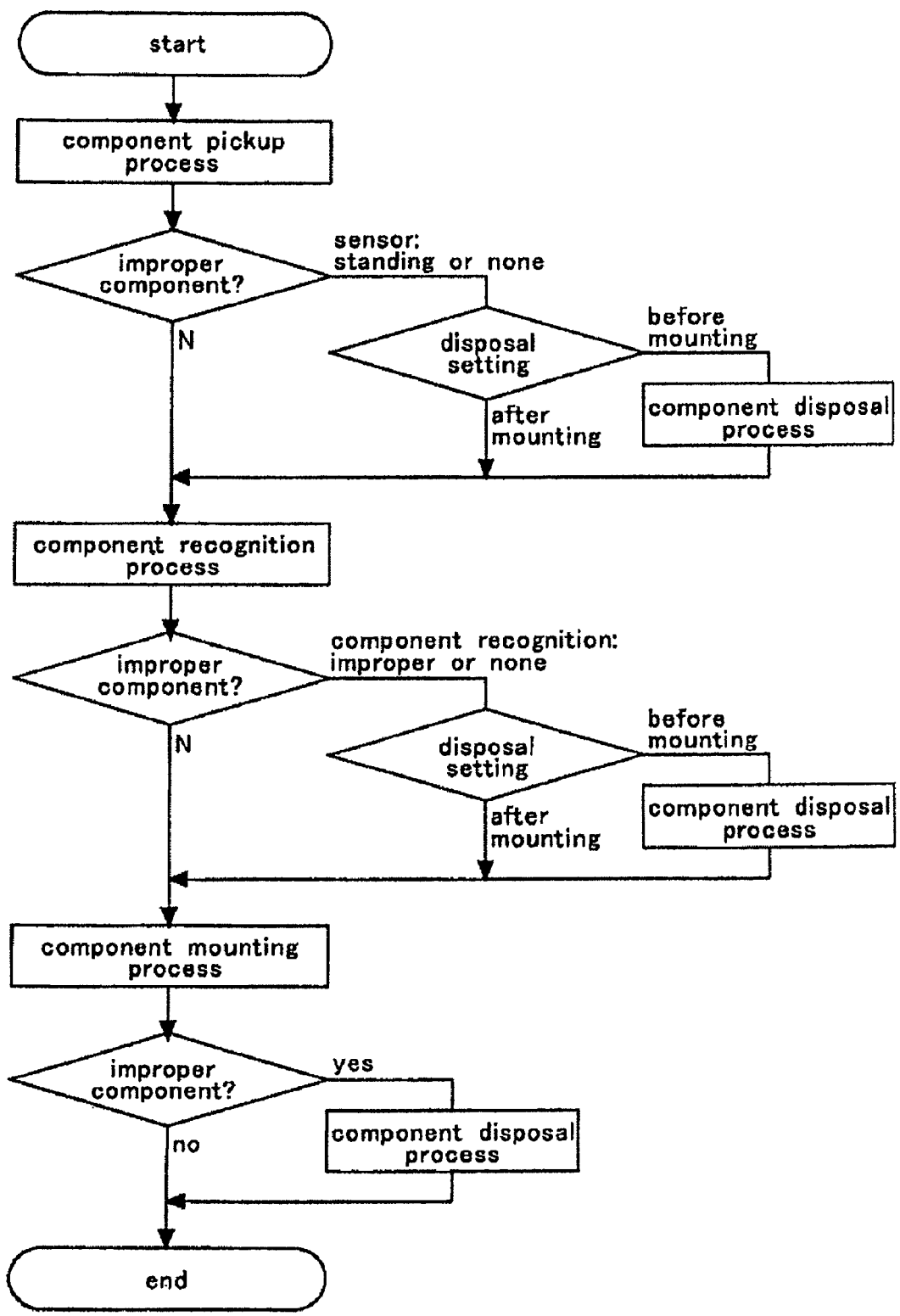
FIG. 10 is a flow chart of a disposal priority mounting sequence.

With the described structure, the operation of mounting the electronic components D will be described hereafter. First, the printed board P is conveyed from the upstream device to the positioning portion through the feeding conveyer 4, and the positioning mechanism starts the positioning operation. Although either the speed priority mounting sequence or the disposal priority mounting sequence can be set as the operation method as described above, the description will be given supposing that all the four blocks are set to the disposal priority mounting sequence, with reference to FIG. 10.

Next, the CPU 90 controls the suction nozzles 15 of the mounting head 16 to pick the electronic components to be picked up from a predetermined component feeding unit 3 according to the mounting data stored in the RAM 92, the suction nozzles 15 corresponding to the types of the electronic components. For this pick-up operation, the CPU 90 controls the linear motors 9 and 14 so that the suction nozzle 15 of the mounting head 16 in the mounting head body 7 moves to a position above the first electronic component in the component feeding unit 3 which has the electronic components to be mounted. Each of the head bodies 7 moves in the Y direction by moving of the beam 8 along the pair of the guides driven by the linear motor 9 and in the X direction along the guides 13 driven by the linear motor 14, both the linear motors 9 and 14 being driven by the drive circuit 95.

At this time, the predetermined component feeding unit 3 is already driven and the electronic component is ready to be picked up at a feeding position of the unit 3. The suction nozzle 15 is selected by rotating of the first inner cylinder 17A and the second inner cylinder 17B of the mounting head 16 driven by the pulse motors 21 and 26, and positioned on one of 0, 3, 6, and 9 o'clock positions in the mounting head 16 and above the component feeding position of the component feeding unit 3. The first cam 30 rotates to set at a predetermined angle driven by the drive motor 31, the second lever 43 turns around the support axis 42, and the vertical shift body 47 descends to lower the vertical shift bar 62 so that the suction nozzle 15 descends by a predetermined stroke to firmly pick the electronic component D up from the component feeding unit 3. Then, the first cam 30 rotates to set at a predetermined angle and the second lever 43 turns so that the vertical shift body 47 rises up to raise the suction nozzle 15.

At this time, the third cam 52 rotates driven by the drive motor 53 to turn the third lever 55, the vacuum valve switch operating body 58 descends corresponding to descending of the vertical shift body 47, and the vertical shift bar 63 descends to push the second switch bar 66 downward. Then, the inner path 15A of the suction nozzle 15 becomes connected to the vacuum source through the connecting path 72, the path 71, and the vacuum path 73, so that the suction nozzle 15 picks the electronic component D up from the component feeding unit 3 by vacuum suction and rises up with the electronic component D. After the twelve suction nozzles 15 of the mounting head 16 pick up the electronic components D in this manner, the mounting head 16 starts moving toward the position above the corresponding component recognition camera 83. During this movement, the mounting head 16 rotates driven by the pulse motors 21 and 26, and the first inner cylinder 17A and the second inner cylinder 17B turn around the strut 75 to rotate the suction nozzle 15 holding the electronic component D by suction. The electronic component D held by the suction nozzle 15 comes between the prism 79 and the light receiving unit 81, and detecting of presence or absence or an attached posture of the electronic component D is performed by detecting height of a lower end surface of the electronic component D at plural positions by the line sensor unit 74.

In a case where the electronic component is detected as being attached to the suction nozzle 15 at its wrong surface or with slanting (FIG. 16), since the disposal setting is set to "before mounting", the mounting head 16 and the suction nozzles 15 move to a position above the disposal box 82, and drops the electronic component D therein for the component disposal process.

After the disposal of this improper electronic component, the CPU 90 moves the mounting head 16 toward above the component recognition camera 83. In the timing that the mounting head 16 passes above the component recognition camera 83, the component recognition camera 83 takes images of all the electronic components D held by suction by the mounting head 16 simultaneously and takes the images therein during the movement of the beam 8, and the recognition processing device 91 performs the component recognition process.

Then, when the component is recognized as improper due to standing or a wrong component or the component is not recognized as a result of the component recognition process, since the disposal setting is set to "before mounting", the mounting head 16 and the suction nozzle 15 move to above the disposal box 82 and drops the improper component D therein, thereby completing the component disposal process.

After the disposal of the improper electronic component, the electronic components D that are judged proper in the detection and the recognition, the vacuum suction of the components is kept and the lower end levels (lower end positions) of the electronic components D are detected by the line sensor unit 74. Therefore, the CPU 90 controls the drive motor 31 to change an amount of a descending stroke of the suction nozzles 15 for mounting the components D on the printed board P corresponding to the lower end levels. This compensates for variations in type of the components D.

That is, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke for mounting of the electronic component D. In this case, the mounting head 16 and the suction nozzle 15 are moved according to the recognition result of the recognition processing device 91, and the electronic component D is mounted on the printed board P. In detail, the CPU 90 receives a recognition result calculated by the component recognition processing device 91, and calculates a coordinate value of a moving target position in X, Y, and θ. Then, the CPU 90 drives the linear motor 9 to move the beam 8 in the Y direction to a target coordinate value calculated with the recognition result, drives the linear motor 14 to move the mounting head 16 in the X direction, and drives the pulse motors 21 and 26 to rotate the suction nozzle 15 to set at a θ angle. The first cam 30 and the second cam 40 rotate so that the suction nozzle 15 descends by a predetermined stroke corresponding to a thickness of the electronic component D, mounts the electronic component D on the printed board P, and rises up. The CPU 90 repeats this operation until all the electronic components D held by suction by the suction nozzles 15 of the mounting head 16 are mounted.

Then, when all the electronic components D specified by the mounting data are mounted on the printed board P, the printed board P is moved from the upstream device onto the left stage 1, the printed board P on the left stage 1 is moved onto the right stage 2, and the printed board P on the stage 2 is moved onto the downstream device.

As described above, in the disposal priority mounting sequence, when there is an electronic component judged improper as a result of the detection or the recognition, the improper electronic component is disposed of and thereafter the only electronic components D judged proper as a result of the recognition are mounted on the printed board P. This can prevent the problem that the improper electronic component drops to the printed board during the mounting operation of the electronic components judged proper as a result of the recognition, which can occur by a mounting method where the improper electronic component is disposed of after the proper electronic components are mounted on the printed board.

In this disposal priority mounting sequence, when the disposal settings of "each improper component" are set to "after mounting", the suction state of the electronic components D held by suction by the suction nozzles 15 are detected by the line sensor unit 74, and then the component recognition camera 83 takes images of the electronic components D held by suction by the suction nozzles 15 and the recognition processing device 91 performs the recognition process. Then, the only electronic components D judged proper as a result of the detection by the line sensor unit 74 and as a result of the recognition by the recognition processing device 91 are mounted on the printed board P, and thereafter the electronic component D judged improper as a result of the detection and the recognition is moved to above the disposal box 82 and is dropped and disposed of therein.

In this case where the disposal setting is set to "after mounting" and there is a component judged improper in the disposal priority mounting sequence, the only electronic components D judged proper as a result of the detection and the recognition are mounted on the printed board P, and thereafter the electronic component judged improper as a result of the detection and the recognition, which corresponds to the type set to the "after mounting" in the disposal settings, is disposed of. Therefore, the electronic components to be disposed of before the mounting operation of the electronic components D can be reduced, and thus the operation of mounting the electronic components can be performed speedily.

Figure 11:
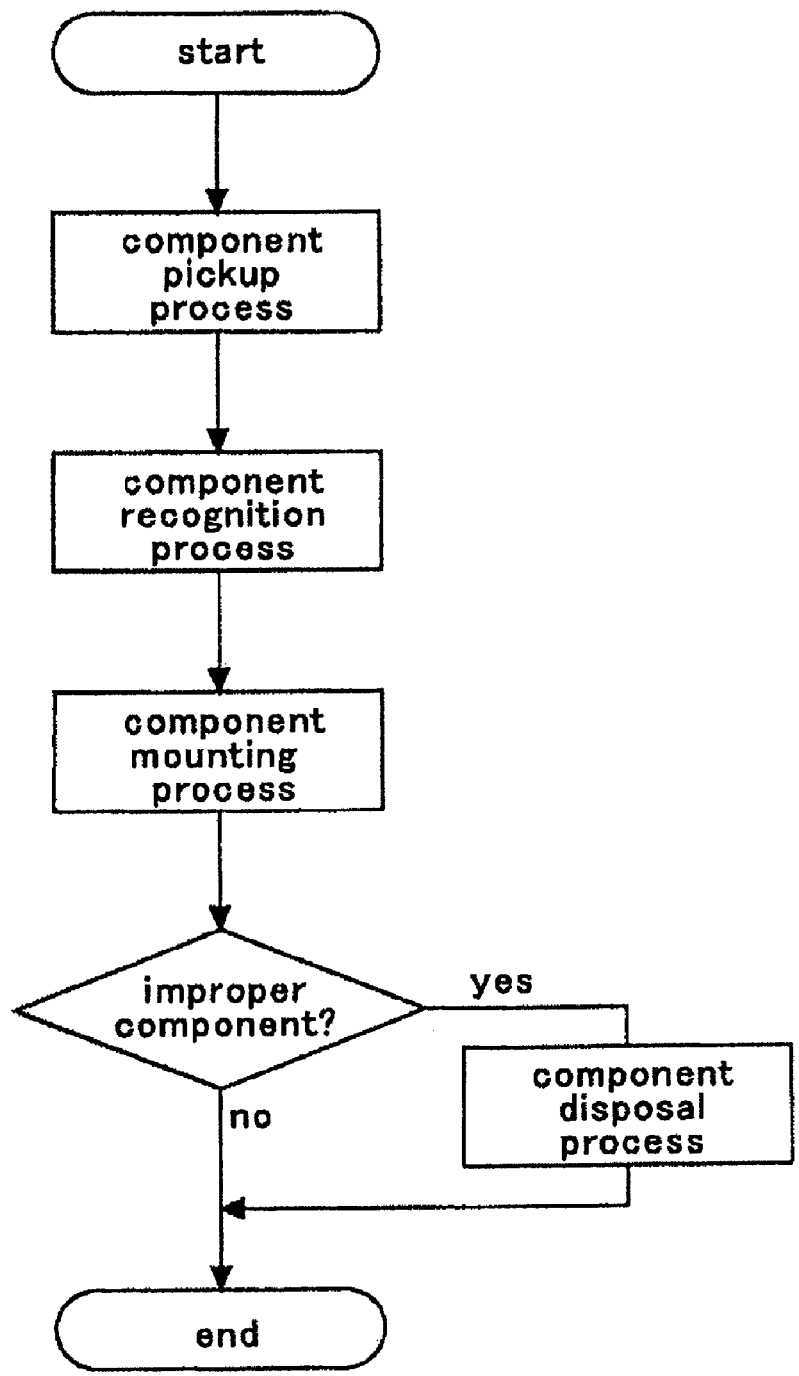
FIG. 11 is a flow chart of a speed priority mounting sequence.

Next, as shown in FIG. 11, when the speed priority mounting sequence is set, the component recognition camera 83 takes images of the electronic components D held by suction by the suction nozzles 15 and the recognition processing device 91 performs the recognition process first. Then, the only electronic components D judged proper as a result of the recognition by this recognition processing device 91 are mounted on the printed board P, and thereafter the electronic component judged improper as a result of the recognition is disposed of.

In this speed priority mounting sequence, the only electronic components D judged proper as a result of the recognition are mounted on the printed board P, and thereafter the electronic component judged improper as a result of the recognition is disposed of. Therefore, the mounting operation of the electronic components can be performed speedily.

As described above, since selection can be made between the disposal priority mounting sequence and the speed priority mounting sequence, the electronic component mounting apparatus is convenient for the operator.

Although particular preferred embodiments of the invention has been disclosed in detail, it will be recognized that variations or modifications of the disclosed apparatus and method are possible based on the disclosure for those skilled in the art and lie within the scope of the present invention.

What is claimed is:

1. A method of mounting an electronic component, comprising:
    picking up a plurality of electronic components from a component feeding unit by suction using a plurality of suction nozzles of a mounting head;
    detecting postures of the electronic components held by the suction nozzles of the mounting head;
    releasing one of the electronic components that is held by one of the suction nozzles of the mounting head and judged improper as a result of the detecting;
    taking, after the releasing of said one of the electronic components held by one of the suction nozzles of the mounting head, images of electronic components that are held by the suction nozzles of the mounting head and judged proper as the result of the detecting using a component recognition camera;
    performing a recognition processing to the images taken by the component recognition camera;

releasing another of the electronic components that is held by another of the suction nozzles of the mounting head and judged improper as a result of the recognition processing;

mounting on a printed board electronic components that are held by the suction nozzles of the mounting head and judged proper as the result of the recognition processing after the releasing of said another of the improper electronic components held by another of the suction nozzles of the mounting head; and after the mounting the electronic components, repeating the steps of the picking up of the electronic components, the detecting of the postures, the taking of the images and the performing of the recognition, wherein the electronic components judged proper by the detecting and the recognition processing are mounted on the printed board for a second time and the electronic components judged improper by the detecting or the recognition processing are released after the second mounting.

* * * * *